(12) United States Patent
Feng et al.

(10) Patent No.: US 12,341,484 B2
(45) Date of Patent: Jun. 24, 2025

(54) FILTER CIRCUIT, FILTER, METHOD OF MANUFACTURING FILTER, AND ELECTRONIC DEVICE

(71) Applicants: Beijing BOE Optoelectronics Technology Co., Ltd., Beijing (CN); BOE TECHNOLOGY GROUP CO., LTD., Beijing (CN)

(72) Inventors: Yulin Feng, Beijing (CN); Yue Li, Beijing (CN); Yuelei Xiao, Beijing (CN); Huiying Li, Beijing (CN); Xue Cao, Beijing (CN); Kidong Han, Beijing (CN); Yanfei Ren, Beijing (CN); Yifan Wu, Beijing (CN); Wenbo Chang, Beijing (CN); Qichang An, Beijing (CN); Biqi Li, Beijing (CN)

(73) Assignees: Beijing BOE Optoelectronics Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/272,790

(22) PCT Filed: Jul. 26, 2022

(86) PCT No.: PCT/CN2022/107817
§ 371 (c)(1),
(2) Date: Jul. 17, 2023

(87) PCT Pub. No.: WO2024/020768
PCT Pub. Date: Feb. 1, 2024

(65) Prior Publication Data
US 2024/0388271 A1  Nov. 21, 2024

(51) Int. Cl.
*H03H 7/38* (2006.01)
*H03H 7/01* (2006.01)
*H03H 7/40* (2006.01)

(52) U.S. Cl.
CPC ............ *H03H 7/0115* (2013.01); *H03H 7/38* (2013.01)

(58) Field of Classification Search
CPC .......... H03H 7/00; H03H 7/01; H03H 7/0153; H03H 7/0161; H03H 7/0115; H03H 7/38; H03H 7/40; H03H 9/0004
(Continued)

(56) References Cited

U.S. PATENT DOCUMENTS 8,830,011 B2 * 9/2014 Jin .................. H03H 7/1758
                                                              333/175
10,931,253 B2 * 2/2021 Ta .................. H03H 7/0115
(Continued)

FOREIGN PATENT DOCUMENTS

CN       101640519 A     2/2010
CN       102340288 A     2/2012
(Continued)

*Primary Examiner* — Hai L Nguyen
(74) *Attorney, Agent, or Firm* — HOUTTEMAN LAW LLC (57) ABSTRACT

A filter circuit includes a first resonant sub-circuit, a second resonant sub-circuit and an impedance matching network; the first resonant sub-circuit and the second resonant sub-circuit are each connected to the impedance matching network in series; the first resonant sub-circuit is configured to allow a signal with a frequency higher than a first frequency to pass; the second resonant sub-circuit is configured to allow a signal with a frequency lower than a second frequency to pass, and the second frequency is greater than the first frequency; the impedance matching network is configured to allow a signal between the first frequency and the second frequency to pass; the impedance matching network (Continued)

includes a first capacitor, a second capacitor, a third capacitor, a fourth capacitor, a fifth capacitor and a first inductor.

20 Claims, 5 Drawing Sheets

(58) Field of Classification Search
USPC .......................... 333/167, 174; 327/552, 557
See application file for complete search history.

(56) References Cited

U.S. PATENT DOCUMENTS

| 2011/0241798 | A1 | 10/2011 | Hong et al. |
| 2013/0106532 | A1 | 5/2013 | Jin et al. |

FOREIGN PATENT DOCUMENTS

| CN | 103166595 | A | 6/2013 |
| CN | 103413994 | A | 11/2013 |
| CN | 108023568 | A | 5/2018 |
| CN | 111049498 | A | 4/2020 |
| CN | 112953431 | A | 6/2021 |
| CN | 114448375 | A | 5/2022 |

* cited by examiner

FILTER CIRCUIT, FILTER, METHOD OF MANUFACTURING FILTER, AND ELECTRONIC DEVICE

TECHNICAL FIELD

The present disclosure belongs to the field of communication technology, and particularly relates to a filter circuit, a filter, a method of manufacturing the filter, and electronic device.

BACKGROUND

With the rapid development of communication signal technology, the signal transmission mode and the signal transmission speed are greatly improved. In addition, advances in semiconductor and microelectronic technologies have resulted in rapid iterations of electronic devices, increasing numbers of mobile devices, and decreasing component sizes. Especially in the current 5G era, the mobile communication technology is in a leap development, and the communication technology is promoted in a big progress in terms of the characteristics of high speed, low time delay, large connection and the like.

The development of communication technology also puts higher requirements on the performance of electronic devices, and the transmission of high-frequency signal requires that the signal is transmitted at high speed and high power under the condition of large bandwidth, which requires that the electronic device may have a good signal transceiving function, and effectively filter invalid signals in the environment. The filter plays a crucial role in the radio frequency front-end device. The filter performs filtering out unwanted signal and frequency selection of wanted signal, through passing and blocking signals with different frequencies, therefore the filter is an essential core component in the radio frequency front-end device. The filters are of different types, including a cavity filter, a dielectric filter, an LC filters, or the like, where the LC filter, which is a common type in filters, implements a filtering function by arranging different numbers of inductors, capacitors, and resistors according to a circuit design, has the characteristics of high performance, small volume, integrated manufacturing, and the like.

SUMMARY

The present disclosure aims to solve at least one technical problem in the prior art and provides a display substrate and a display device.

In a first aspect, an embodiment of the present disclosure provides a filter circuit, including a first resonant sub-circuit, a second resonant sub-circuit and an impedance matching network; where each of the first resonant sub-circuit and the second resonant sub-circuit is connected to the impedance matching network in series;

the first resonant sub-circuit is configured to allow a signal with a frequency higher than a first frequency to pass; the second resonant sub-circuit is configured to allow a signal with a frequency lower than a second frequency to pass, and the second frequency is greater than the first frequency; the impedance matching network is configured to allow a signal between the first frequency and the second frequency to pass; the impedance matching network includes a first capacitor, a second capacitor, a third capacitor, a fourth capacitor, a fifth capacitor and a first inductor; and a first terminal of the first capacitor is connected to a first terminal of the fourth capacitor, and a second terminal of the first capacitor is connected to a first terminal of the first inductor and a first terminal of the second capacitor; a second terminal of the second capacitor is connected to a first terminal of the third capacitor and a second terminal of the fifth capacitor; and a second terminal of the fourth capacitor is connected to a first terminal of the fifth capacitor, a second terminal of the first inductor and a reference signal terminal.

The first resonator sub-circuit is connected to the first terminal of the first capacitor, the second resonator sub-circuit is connected to a second terminal of the third capacitor; or the second resonant sub-circuit is connected to the first terminal of the first capacitor, and the first resonant sub-circuit is connected to the second terminal of the third capacitor.

The first resonator sub-circuit includes a sixth capacitor and a second inductor; and the sixth capacitor is connected to the second inductor in parallel.

A capacitance value of the sixth capacitor is less than 20 pF; and/or an inductance value of the second inductor is less than 20 nH.

The second resonator sub-circuit includes a seventh capacitor and a third inductor; and the seventh capacitor is connected to the third inductor in parallel.

A capacitance value of the seventh capacitor is less than 20 pF; and/or an inductance value of the third inductor is less than 20 nH.

A capacitance value of each the first capacitor, the second capacitor, the third capacitor, the fourth capacitor, and the fifth capacitor is less than 20 pF; and/or an inductance value of the first inductor is less than 20 nH.

The impedance matching network further includes an eighth capacitor; a first terminal of the eighth capacitor is connected to the first resonant sub-circuit, and a second terminal of the third capacitor is connected to the second resonant sub-circuit; and a second terminal of the eighth capacitor is connected to the first terminal of the first capacitor and the first terminal of the fourth capacitor.

In a second aspect, the present disclosure provides a filter, including any one of the filter circuits described above.

The filter further includes a first base substrate on which the filter circuit is arranged; the first resonant sub-circuit, the second resonant sub-circuit and the impedance matching network each include a capacitor and an inductor, and the capacitor in the impedance matching network include the first capacitor, the second capacitor, the third capacitor, the fourth capacitor and the fifth capacitor; the capacitor in the impedance matching network includes the first inductor; the inductor includes a plurality of substructures sequentially arranged along a direction away from the first base substrate, an interlayer insulating layer is between any two adjacent ones of the plurality of substructures, and any two adjacent ones of the plurality of substructures are connected together through a via penetrating through the interlayer insulating layer, such that a coil structure of the inductor is formed; the capacitor includes a first plate and a second plate sequentially arranged along the direction away from the first base substrate, and a dielectric layer between the first plate and the second plate.

At least one of the first plate and the second plate is in a same layer as one of the plurality of substructures.

Orthographic projections of any two of the plurality of substructures on the first base substrate overlap each other.

The filter further includes a protective layer on a side of the inductor and the capacitor away from the first base substrate.

The filter further includes an encapsulation substrate, an opening is in the protection layer at a position corresponding to a port of the filter circuit, and the port of the filter circuit is connected to the encapsulation substrate through the opening.

A connection structure is in the opening, and the port of the filter circuit is connected to the encapsulation substrate through the connection structure.

In a third aspect, an embodiment of the present disclosure provides a method of manufacturing a filter, including: forming a filter circuit on a first base substrate, where the filter circuit includes any one of the filter circuits described above.

The first resonator sub-circuit, the second resonator sub-circuit, and the impedance matching network each include a capacitor and an inductor; forming the inductor includes:
  sequentially forming a plurality of substructures on the first base substrate, forming an interlayer insulating layer between any two adjacent ones of the plurality of substructures, and connecting any two adjacent ones of the plurality of substructures through a via in the interlayer insulating layer, such that a coil structure of the inductor is formed; and
forming the capacitor includes:
sequentially forming a first plate and a second plate along a direction away from the first base substrate, and forming a dielectric layer between the first plate and the second plate.

At least one of the first plate and the second plate is formed in one same process as one of the plurality of substructures.

Orthographic projections of any two of the plurality of substructures on the first base substrate overlap each other.

The method of manufacturing a filter further includes: forming a protective layer on a side of the inductor and the capacitor away from the first base substrate.

In a fourth aspect, the present disclosure provides an electronic device, including any one of the filters described above.

DETAIL DESCRIPTION OF EMBODIMENTS

In order to enable one of ordinary skill in the art to better understand the technical solutions of the present disclosure, the present disclosure will be further described in detail below with reference to the accompanying drawings and specific embodiments.

Unless defined otherwise, technical or scientific terms used herein shall have the ordinary meaning as understood by one of ordinary skill in the art to which this disclosure belongs. The use of "first", "second", and the like in the present disclosure is not intended to indicate any order, quantity, or importance, but rather serves to distinguish one element from another. Also, the term "a", "an", "the" or the like does not denote a limitation of quantity, but rather denotes the presence of at least one. The word "comprising", "comprises", or the like means that the element or item preceding the word includes the element or item listed after the word and its equivalent, but does not exclude other elements or items. The term "connected", "coupled" or the like is not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

Figure 1:
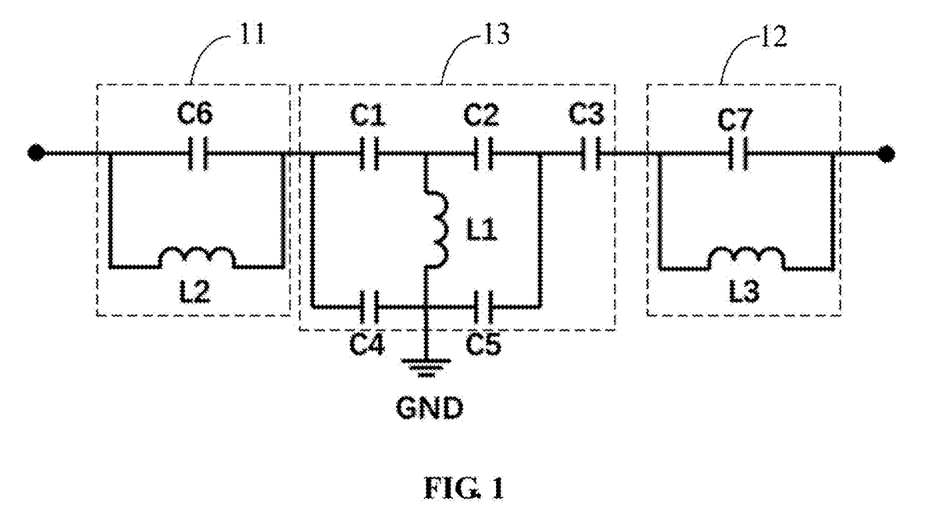
FIG. 1 is a circuit diagram of a filter circuit according to an embodiment of the present disclosure.

In a first aspect, FIG. 1 is a circuit diagram of a filter circuit according to an embodiment of the present disclosure. As shown in FIG. 1, the present disclosure provides a filter circuit, which includes a first resonator sub-circuit 11, a second resonator sub-circuit 12, and an impedance matching network 13. The first resonator sub-circuit 11 is configured to allow a signal with a frequency higher than a first frequency to pass, the second resonator sub-circuit 12 is configured to allow a signal with a frequency lower than a second frequency to pass, and the second frequency is greater than the first frequency. The impedance matching network 13 allows a signal with a frequency between the first frequency and the second frequency to pass. That is, the first resonator sub-circuit 11 is a high-pass filter for adjusting a left sideband of the signal; the second resonator sub-circuit 12 is a low-pass filter for adjusting a right sideband of the signal; and the impedance matching network 13 acts as a band-pass filter, attenuating a signal with a frequency less than the first frequency or greater than the second frequency. The first resonator sub-circuit 11, the second resonator sub-circuit 12 and the impedance matching network 13 may adjust out-of-band attenuation and transmission zero, so that the characteristics of large bandwidth, low loss, rapid out-of-band attenuation and the like are achieved within a radio frequency range.

The electrical connection relationships among the first resonator sub-circuit 11, the second resonator sub-circuit 12, and the impedance matching network 13 may be interchanged. In one example, the impedance matching network 13 is connected between the first resonator sub-circuit 11 and the second resonator sub-circuit 12, that is, the first resonator sub-circuit 11 and the second resonator sub-circuit 12 are symmetrically arranged with respect to the impedance matching network 13. Of course, it is merely taken as an example in the embodiment of the present disclosure that the first resonator sub-circuit 11 and the second resonator sub-circuit 12 are symmetrically arranged with respect to the impedance matching network 13, but this does not limit the connection manner of the filter circuit in the embodiment of the present disclosure. Meanwhile, it should be noted that one terminal of the first resonator sub-circuit 11 is connected to the impedance matching network 13, and the other terminal of the first resonator sub-circuit 11 is used as an input port of the filter circuit, and one terminal of the second resonator sub-circuit 12 is connected to the impedance matching network 13, and the other terminal of the second resonator sub-circuit 12 is used as an output port of the filter circuit.

In the present disclosure, referring to FIG. 1, the impedance matching network 13 includes a first capacitor C1, a second capacitor C2, a third capacitor C3, a fourth capacitor C4, a fifth capacitor C5, and a first inductor L1. A first terminal of the first capacitor C1 is connected to a first terminal of the fourth capacitor C4 and the first resonator sub-circuit 11; a second terminal of the first capacitor C1 is connected to a first terminal of the first inductor L1 and a first terminal of the second capacitor C2; a second terminal of the second capacitor C2 is connected to a first terminal of the third capacitor C3 and a second terminal of the fifth capacitor C5; a second terminal of the third capacitor C3 is connected to the second resonator sub-circuit 12; a second terminal of the fourth capacitor C4 is connected to a first terminal of the fifth capacitor C5, a second terminal of the first inductor L1, and a reference signal terminal. The reference signal terminal includes, but is not limited to, a ground terminal GND.

The impedance matching network 13 in the embodiment of the present disclosure forms a main part of the filter circuit. The first capacitor C1, the second capacitor C2 and the third capacitor C3 in a main line are connected in series, and the fourth capacitor C4, the fifth capacitor C5 and the first inductor L1 in branch lines are combined for adjustment, so that a structure with a wide bandwidth and a low passband ripple can be formed. Meanwhile, in the embodiment of the present disclosure, by combining the impedance matching network 13 with the first resonator sub-circuit 11 and the second resonator sub-circuit 12, a band-pass filter with a low passband ripple, a small size and a low loss can be effectively formed.

In some examples, the first resonator sub-circuit 11 may include a sixth capacitor and a second inductor L2 connected in parallel. The second resonator sub-circuit 12 may have a seventh capacitor and a third inductor L3 connected in parallel.

In some examples, each of inductance values of the inductors in the filter circuit is less than 20 nH. That is to say, the inductance values of the first inductor L1, the second inductor L2 and the third inductor L3 in the filter circuit are all lower, and less than 20 nH. Each of capacitance values of the capacitors in the filter circuit is less than 20 pF. That is to say, the capacitance values of the first capacitor C1, the second capacitor C2, the third capacitor C3, the fourth capacitor C4, the fifth capacitor C5, the sixth capacitor and the seventh capacitor in the filter circuit are all less than 20 pF. In this case, the size of each element in the filter circuit is small, so that the size of the component can be effectively reduced, and a high-performance filter circuit can be effectively formed in a high-frequency band.

Figure 2:
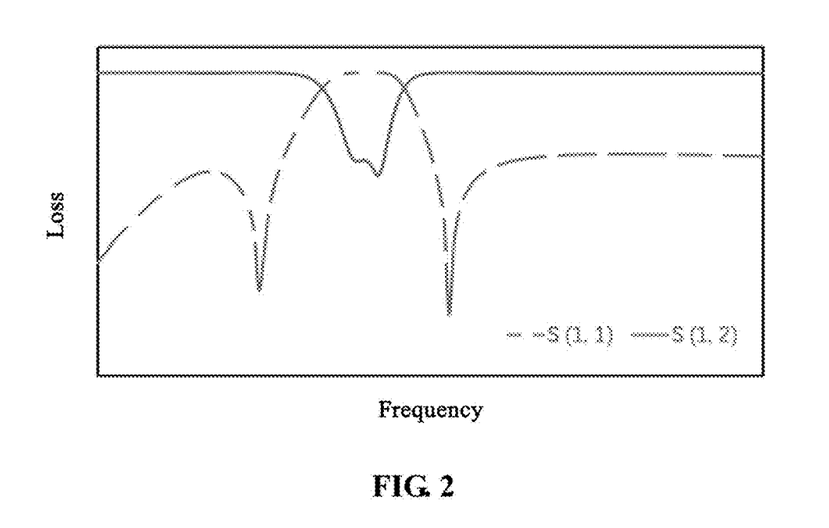
FIG. 2 is a simulation diagram of filtering performance of a filter circuit according to an embodiment of the present disclosure.

FIG. 2 is a simulation diagram of filtering performance of a filter circuit according to an embodiment of the present disclosure. It can be seen from FIG. 2 that the filter circuit has a low insertion loss in a passband, and simultaneously has a large echo characteristic in the passband, which is beneficial to inputting and filtering a signal. Meanwhile, the filter circuit has better out-of-band attenuation characteristics, and the signal can be rapidly reduced outside the passband, thereby being beneficial to effective filtering of the signal.

Figure 3:
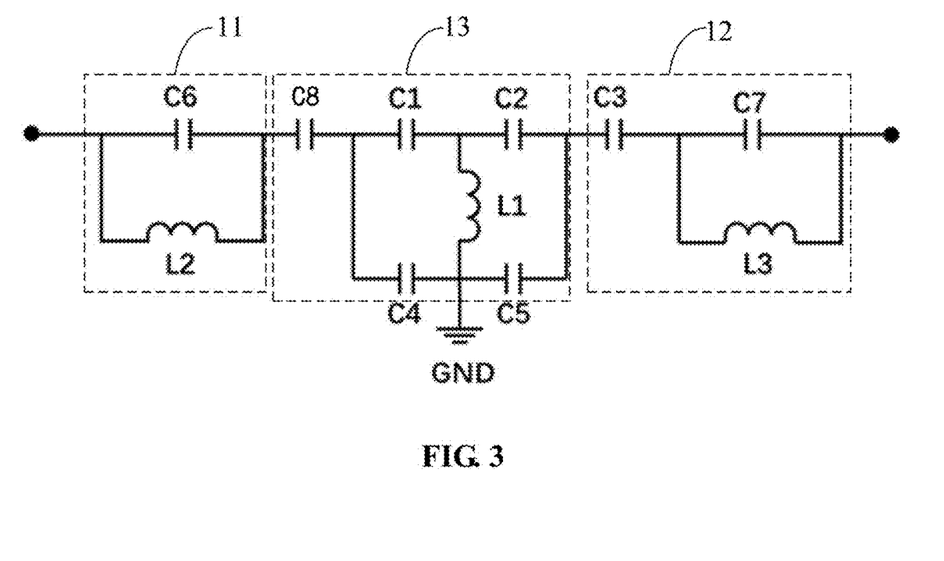
FIG. 3 is a circuit diagram of another filter circuit according to an embodiment of the present disclosure.
Figure 4:
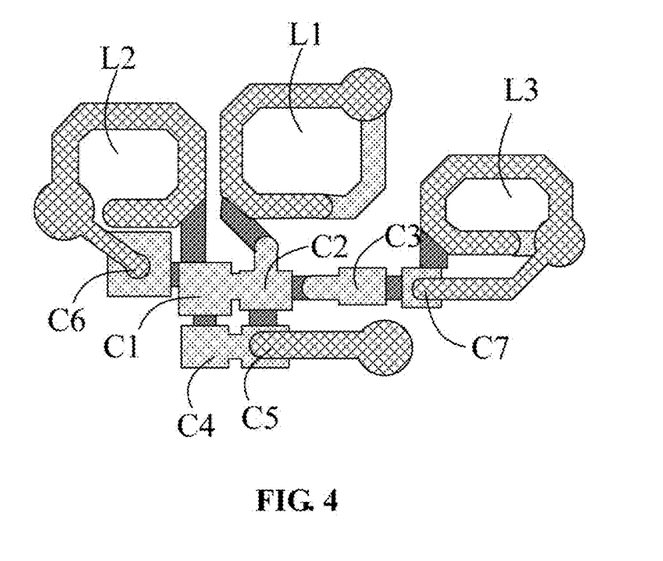
FIG. 4 is a layout of a filter according to an embodiment of the present disclosure.
Figure 5:
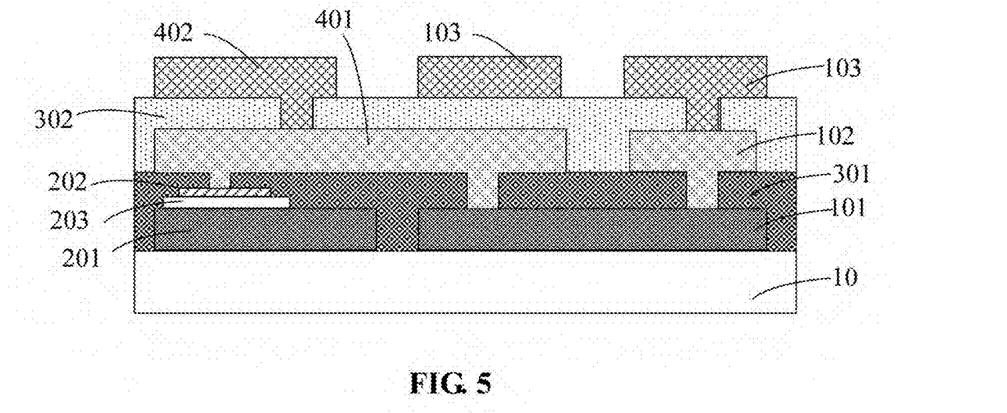
FIG. 5 is a cross-sectional view of a part of a filter according to an embodiment of the present disclosure.
Figure 6:
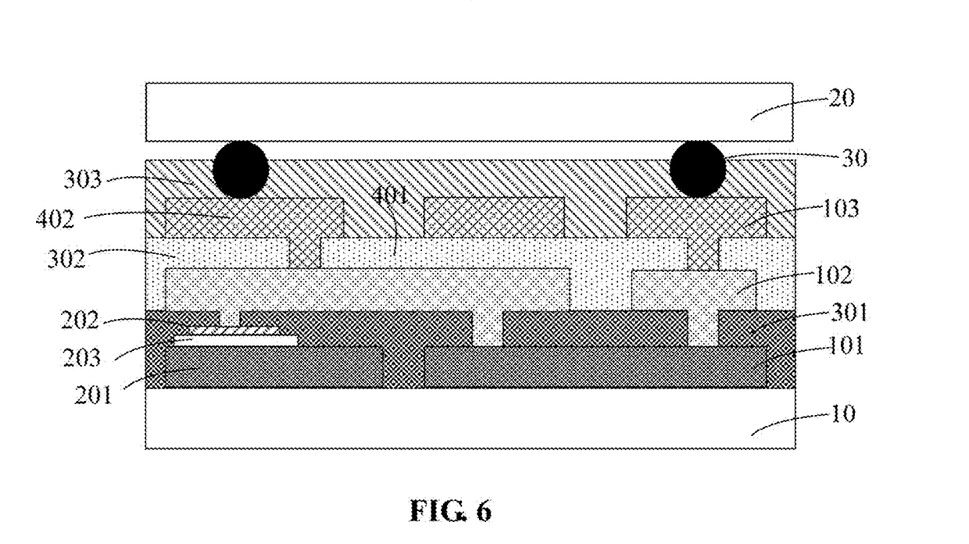
FIG. 6 is a cross-sectional view of a part of another filter according to an embodiment of the present disclosure.

In some examples, FIG. 3 is a circuit diagram of another filter circuit according to an embodiment of the present disclosure. As shown in FIG. 2, an embodiment of the present disclosure further provides a filter circuit, which has substantially the same structure as that of the filter circuit shown in FIG. 1, except that the impedance matching network in the filter circuit includes not only the first capacitor C1, the second capacitor C2, the third capacitor C3, the fourth capacitor C4, the fifth capacitor C5 and the first inductor L1 as describe above, but also includes an eighth capacitor C8. A first terminal of the eighth capacitor C8 is connected to the first resonator sub-circuit 11, and a second terminal of the eighth capacitor C8 is connected to the first terminal of the first capacitor C1 and the first terminal of the fourth capacitor C4. The second terminal of the third capacitor C3 is connected to the second resonator sub-circuit 12. As can be seen from FIG. 3, the first resonator sub-circuit 11 and the second resonator sub-circuit 12 are symmetrically arranged with respect to the impedance matching network 13. The structure has better out-of-band attenuation characteristic, and the signal can be rapidly reduced outside the passband, thereby being beneficial to effective filtering of the signal. FIG. 4 is a layout of a filter according to an embodiment of the present disclosure; FIG. 5 is a cross-sectional view of a part of a filter according to an embodiment of the present disclosure; FIG. 6 is a cross-sectional view of a part of another filter according to an embodiment of the present disclosure. In a second aspect, as shown in FIGS. 4 to 6, an embodiment of the present disclosure provides a filter including the filter circuit described above. The filter in an embodiment of the present disclosure further includes a first base substrate 10, and the filter circuit is arranged on the first base substrate 10. That is, both the capacitors and the inductors in the filter circuit are arranged on the first base substrate 10. The capacitors and inductors in the filter circuit include the capacitors and inductors in the first resonator sub-circuit 11, the second resonator sub-circuit 12, and the impedance matching network 13. For convenience of description, the capacitors in the first resonator sub-circuit 11, the second resonator sub-circuit 12, and the impedance matching network 13 are not distinguished and are referred to as capacitors. Similarly, the inductors in the first resonator sub-circuit 11, the second resonator sub-circuit 12, and the impedance matching network 13 are not distinguished and are referred to as inductors. The inductor includes a plurality of substructures that are sequentially arranged along a direction away from the first base substrate 10, an interlayer insulating layer is arranged between any two adjacent ones of the plurality of substructures, and any two adjacent ones of the plurality of substructures are connected together through a via penetrating through the interlayer insulating layer, so that a coil structure of the inductor is formed. For example, each substructure is an open-loop structure, and the substructures located in adjacent layers are in end-to-end connection (that is, an end of one of any two substructures located in any two adjacent layers is connected to an end of the other of the two substructures), so that the coil structure of the inductor is formed. The capacitor includes a first plate 201 and a second plate 202 arranged in sequence in a direction away from the first base substrate 10, and a dielectric layer 203 arranged between the first plate 201 and the second plate 202.

It should be noted that, it is taken as an example in the figure that an inductor is connected to a capacitor, and the inductor includes three substructures stacked together. For convenience of description, the three substructures are referred to as a first substructure 101, a second substructure 102, and a third substructure 103, respectively; an interlayer insulating layer between the first substructure 101 and the second substructure 102 is referred to as a first interlayer insulating layer 301; and an interlayer insulating layer between the second substructure 102 and the third substructure 103 is referred to as a second interlayer insulating layer 302. The first substructures 101 of respective inductors are arranged in a same layer, the second substructures 102 of the respective inductors are arranged in a same layer, and the third substructures 103 of the respective inductors are arranged in a same layer. The first plates 201 of respective capacitors are arranged in a same layer, and the second plates 202 of the respective capacitors are arranged in a same layer. The capacitor and the inductor are connected together through a first connection electrode 401, and the first connection electrode 401 is connected to a second connection electrode 402 for connection to an external circuit.

Furthermore, at least one of the first plate 201 and the second plate 202 of the capacitor is arranged in a same layer as a substructure of the inductor. For example, the first plate 201 of the capacitor is arranged in a same layer as a substructure, and the second plate 202 may be arranged in a separate layer.

Furthermore, orthographic projections of any two of the substructures of the inductor on the first base substrate 10 at least partially overlap each other. Through such an arrangement, the size of the component can be effectively reduced, which is favorable to improve an integration level of an electronic device, to which the filter circuit is applied.

In some examples, the filter may include not only the above structure, but also a protective layer arranged on a side of the capacitor and the inductor away from the first base substrate 10, to prevent the components in the filter circuit from being corroded by water and oxygen.

Furthermore, openings are arranged in the protective layer at positions corresponding to the respective ports of the filter circuit. For example, openings penetrating through the protective layer are formed at positions corresponding to the input port and the output port of the filter circuit, respectively, so that the input port and the output port are each connected to an external circuit.

In some examples, the filter further includes an encapsulation substrate 20, and each port of the filter circuit on the first base substrate 10 is connected to the encapsulation substrate 20 through a connection structure 30, which includes, but is not limited to, a solder ball and a copper pillar. Where the connection structure 30 employs a solder pillar, each port of the filter circuit and the encapsulation substrate 20 may be soldered together. Where the connection structure 30 employs a copper pillar, the copper pillar is required to be connected to each port of the filter circuit through a conductive bonding layer, and then the copper pillar is connected to the encapsulation substrate 20. It should be understood that traces or other components to which the filter circuit is connected are arranged on the encapsulation substrate 20.

In some examples, referring to FIG. 3, five capacitors (a first capacitor C1, a second capacitor C2, a third capacitor C3, a fourth capacitor C4, and a fifth capacitor C5) and three inductors (a first inductor L1, a second inductor L2, and a third inductor L3) in the filter circuit may be arranged in the manner shown in FIG. 3. That is, the five capacitors are intensively arranged below the three inductors, so that the component size can be reduced as much as possible, and miniaturization of the filter can be achieved. The first plate 201 and the second plate 202 of the capacitor may be effectively connected to the inductor in the circuit, through vias in a metal, according to the circuit design.

The material of a structure in each layer in the filter will be described specifically with reference to the following method of manufacturing the filter.

In a third aspect, the present disclosure provides a method of manufacturing a filter, which includes a step of forming a filter circuit on a first base substrate 10. The following describes a method of manufacturing a filter according to an embodiment of the present disclosure with reference to a specific method. Taking an embodiment in which the filter circuit includes three substructures stacked on each other as an example, and for convenience of description, three substructures are referred to as a first substructure 101, a second substructure 102 and a third substructure 103, respectively; an interlayer insulating layer between the first substructure 101 and the second substructure 102 is referred to as a first interlayer insulating layer 301, and an interlayer insulating layer between the second substructure 102 and the third substructure 103 is referred to as a second interlayer insulating layer 302. The first substructures 101 of respective inductors are arranged in a same layer, the second substructures 102 of the respective inductors are arranged in a same layer, and the third substructures 103 of the respective inductors are arranged in a same layer. The first plates 201 of respective capacitors are arranged in a same layer, and the second plates 202 of the respective capacitors are arranged in a same layer. Therefore, the following manufacturing method will be described only with reference to the manufacturing flow of the capacitors and inductors in the first resonator sub-circuit 11.

Figure 7:
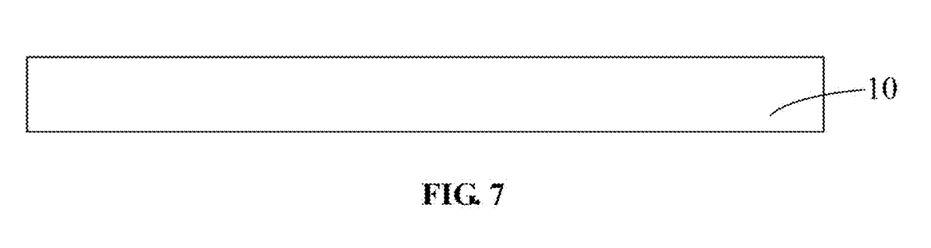
FIG. 7 is a schematic diagram illustrating a structure of an intermediate product formed in step S11 of a method of manufacturing a filter according to an embodiment of the present disclosure.
Figure 8:
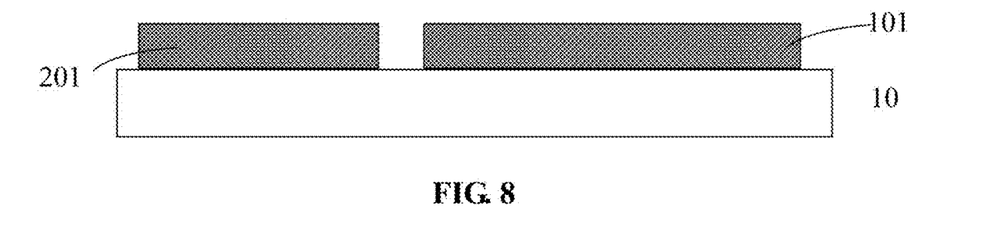
FIG. 8 is a schematic diagram illustrating a structure of an intermediate product formed in step S12 of a method of manufacturing a filter according to an embodiment of the present disclosure.
Figure 9:
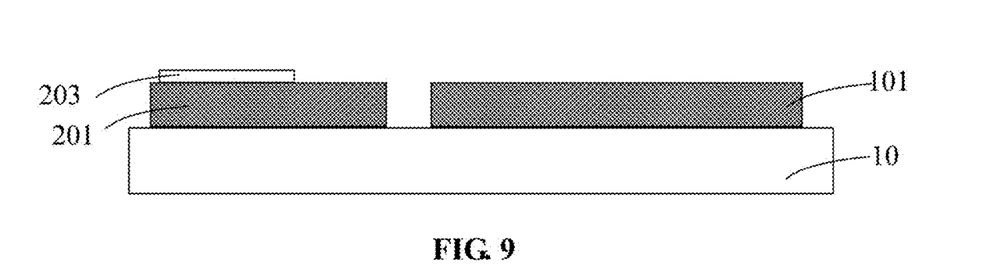
FIG. 9 is a schematic diagram illustrating a structure of an intermediate product formed in step S13 of a method of manufacturing a filter according to an embodiment of the present disclosure.
Figure 10:
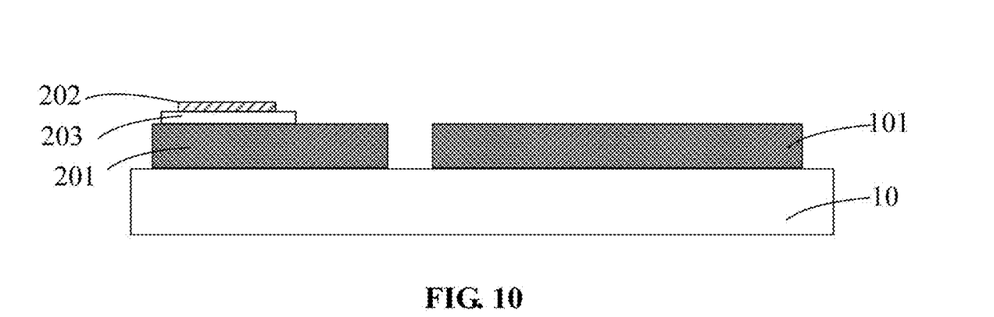
FIG. 10 is a schematic diagram illustrating a structure of an intermediate product formed in step S14 of a method of manufacturing a filter according to an embodiment of the present disclosure.
Figure 11:
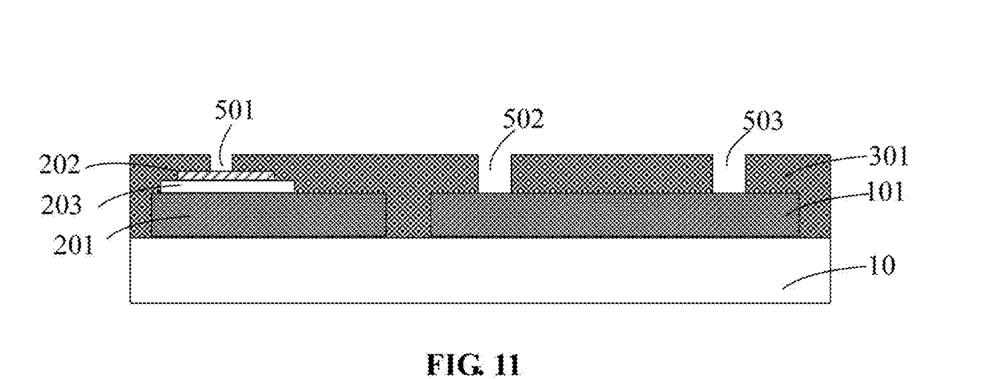
FIG. 11 is a schematic diagram illustrating a structure of an intermediate product formed in step S15 of a method of manufacturing a filter according to an embodiment of the present disclosure.
Figure 12:
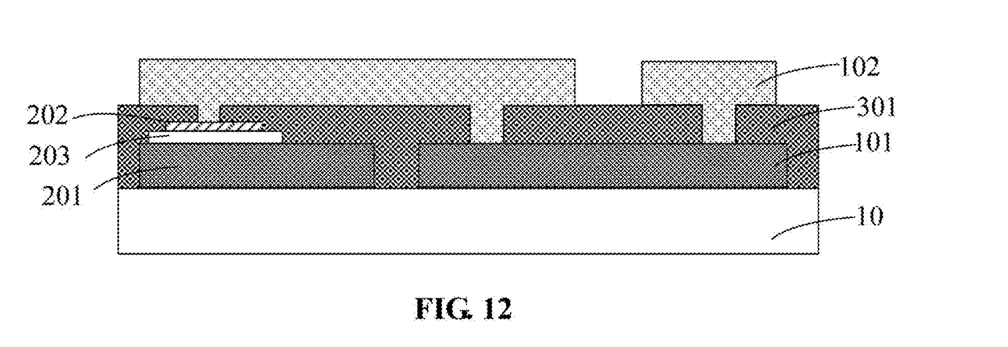
FIG. 12 is a schematic diagram illustrating a structure of an intermediate product formed in step S16 of a method of manufacturing a filter according to an embodiment of the present disclosure.
Figure 13:
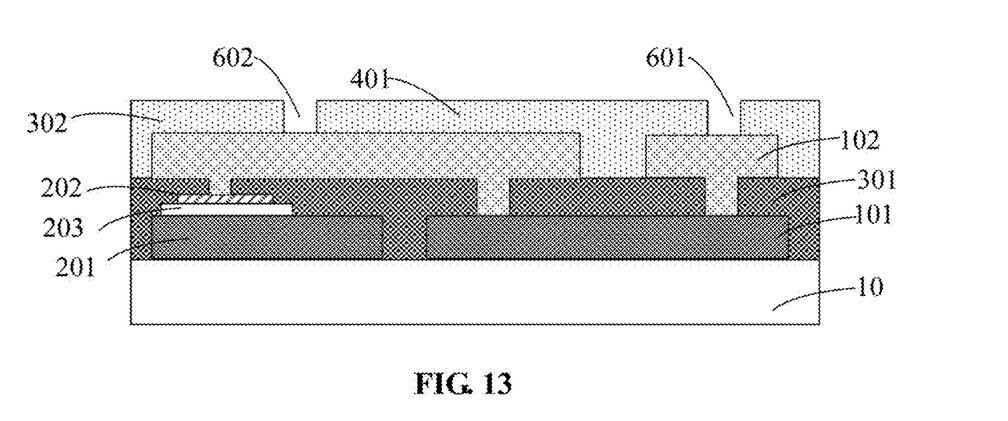
FIG. 13 is a schematic diagram illustrating a structure of an intermediate product formed in step S17 of a method of manufacturing a filter according to an embodiment of the present disclosure.
Figure 14:
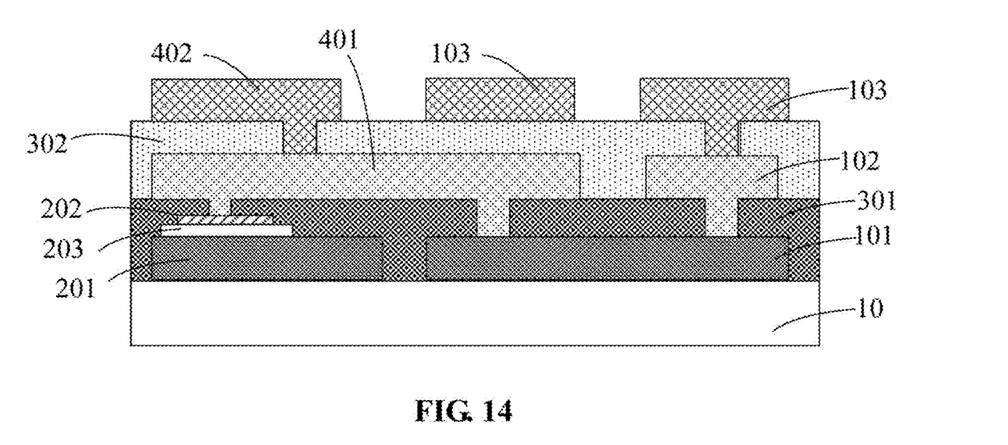
FIG. 14 is a schematic diagram illustrating a structure of an intermediate product formed in step S18 of a method of manufacturing a filter according to an embodiment of the present disclosure.

FIG. 7 is a schematic diagram illustrating a structure of an intermediate product formed in step S11 of a method of manufacturing a filter according to an embodiment of the present disclosure; FIG. 8 is a schematic diagram illustrating a structure of an intermediate product formed in step S12 of a method of manufacturing a filter according to an embodiment of the present disclosure; FIG. 9 is a schematic diagram illustrating a structure of an intermediate product formed in step S13 of a method of manufacturing a filter according to an embodiment of the present disclosure; FIG. 10 is a schematic diagram illustrating a structure of an intermediate product formed in step S14 of a method of manufacturing a filter according to an embodiment of the present disclosure; FIG. 11 is a schematic diagram illustrating a structure of an intermediate product formed in step S15 of a method of manufacturing a filter according to an embodiment of the present disclosure; FIG. 12 is a schematic diagram illustrating a structure of an intermediate product formed in step S16 of a method of manufacturing a filter according to an embodiment of the present disclosure; FIG. 13 is a schematic diagram illustrating a structure of an intermediate product formed in step S17 of a method of manufacturing a filter according to an embodiment of the present disclosure; and FIG. 14 is a schematic diagram illustrating a structure of an intermediate product formed in step S18 of a method of manufacturing a filter according to an embodiment of the present disclosure. With reference to FIGS. 7 to 14, a method of manufacturing a filter according to an embodiment of the present disclosure includes the following steps S11 to S19.

S11, providing a first base substrate 10, as shown in FIG. 7.

In some examples, a material of the first base substrate 10 may be a material with low conductivity, such as glass, high-resistivity silicon, ceramic, or the like, and a thickness of the first base substrate 10 is in a range of about 0.2 mm to 2 mm. Step S11 may include cleaning the first base substrate 10, performing ultrasonic cleaning with deionized water and an organic solvent for 15 min or more, respectively, and finally drying with an oven at 70° C. for 30 min.

S12, forming a first plate 201 of the capacitor and a first substructure 101 of the inductor on the first base substrate 10, as shown in FIG. 8.

In some examples, step S12 may include: forming a first conductive layer on the first base substrate 10 through a method including, but not limited to, sputtering; with the first conductive layer as a seed layer, spin coating a photoresist, exposing and developing the photoresist, and forming the first plate 201 of the capacitor and the first substructure 101 of the inductor through electroplating/electroless plating. A material of the first conductive layer includes, but is not limited to, a metal material such as Au, Al, Ag, Cu, or the like. Each of the first plate 201 of the capacitor and the first substructure 101 of the inductor has a thickness in a range of about 1 μm to 20 μm.

Furthermore, in order to ensure flatness, after the first plate 201 of the capacitor and the first substructure 101 of the inductor are formed through electroplating/electroless plating, the formed structures may be subjected to a chemical mechanical polishing process to treat the surfaces thereof.

S13, forming a dielectric layer 203 of the capacitor, as shown in FIG. 9.

In some examples, a material of the dielectric layer 203 may be an inorganic material, such as silicon nitride, silicon oxide, or the like; and a thickness of the dielectric layer 203 is in a range of about 0.1 μm to 1 μm. Step S13 may include: forming a layer of the dielectric layer 203 through, but not limited to, PVD or CVD; then spin coating a photoresist, exposing and developing the photoresist, and etching to form the dielectric layer 203 on the side of the first plate 201 away from the first base substrate 10. Alternatively, in order to ensure a flatness of the layer, the formed dielectric layer 203 may be subjected to chemical mechanical polishing process to treat the surfaces thereof.

S14, forming a second plate 202 of the capacitor, as shown in FIG. 10.

In some examples, step S14 may include: forming a second conductive layer through a method including, but not limited to, sputtering; with the second conductive layer as a seed layer, spin coating a photoresist, exposing and developing the photoresist, and forming the second plate 202 of the capacitor through electroplating/electroless plating. A material of the second conductive layer includes, but is not limited to, a metal material such as Au, Al, Ag, Cu, or the like. A thickness of the second plate 202 of the capacitor is in a range of about 0.1 μm to 3 μm.

S15, forming a first interlayer insulating layer 301, and forming a first via 501 at a position corresponding to the second plate 202 of the capacitor, and forming a second via 502 and a third via 503 at positions corresponding to the first substructure 101 of the capacitor, as shown in FIG. 11.

In some examples, a material of the first interlayer insulating layer 301 may be an inorganic material, such as silicon nitride, silicon oxide, or the like; and a thickness of the first interlayer insulating layer 301 is in a range of about 1 μm to 20 μm. Step S15 may include: forming the first interlayer insulating layer 301 of an inorganic material through PVD or CVD; and then spin coating a photoresist, exposing and developing the photoresist, and etching to form the first via 501, the second via 502, and the third via 503.

In some examples, the material of the first interlayer insulating layer 301 may be an organic material, such as polyimide (PI) or other resin material. Step S15 may include: patterning the first interlayer insulating layer 301 through a spin coating process, to form the first via 501, the second via 502, and the third via 503.

S16, forming a first connection electrode 401 and a second substructure 102 of the inductor, where the first connection electrode 401 electrically connects the first substructure 101 of the inductor and the second plate 202 of the capacitor together, through the first via 501 and the second via 502, and the second substructure 102 is connected to the first substructure 101 through the third via 503, as shown in FIG. 12.

In some examples, step S14 may include: forming the second conductive layer through a method including, but not limited to, sputtering; with the second conductive layer as a seed layer, spin coating a photoresist, exposing and developing the photoresist, and forming the first connection electrode 401 and the second substructure 102 of the inductor through electroplating/electroless plating. A material of the first conductive layer includes, but is not limited to, a metal material such as Au, Al, Ag, Cu, or the like. Each of the first plate 201 of the capacitor and the first substructure 101 of the inductor has a thickness in a range of about 1 μm to 20 μm.

S17, forming a second interlayer insulating layer 302, forming a fourth via 601 at a position corresponding to the second substructure 102 of the inductor, and forming a fifth via 602 at a position corresponding to the first connection, as shown in FIG. 13.

In some examples, a material of the second interlayer insulating layer 302 may be an inorganic material, such as silicon nitride, silicon oxide, or the like; and a thickness of the second interlayer insulating layer 302 is in a range of about 1 μm to 20 μm. Step S17 may include: forming the second interlayer insulating layer 302 of an inorganic material through PVD or CVD; and then spin coating a photoresist, exposing and developing the photoresist, and etching to form the fourth via 601 and the fifth via 602.

In some examples, the material of the second interlayer insulating layer 302 may be an organic material, such as polyimide (PI) or other resin material. Step S17 may include: patterning the second interlayer insulating layer 302 through a spin coating process, to form the fourth via 601 and the fifth via 602.

S18, forming a second connection electrode 402 and a third substructure 103 of the inductor, where the third substructure 103 is connected to the second substructure 102 through the fourth via 601, and the second connection electrode 402 is connected to the first connection electrode 401 through the fifth via 602. The second connection electrode 402 and the first connection electrode 401 may be connected together, as an input port of the filter circuit, as shown in FIG. 14.

S19, forming a protective layer, and forming a first opening and a second opening which penetrate through the protective layer, where the first opening and the second opening may be used to electrically connect the circuits on the encapsulation substrate 20 to the ports on the filter circuit. For example, connection structures 30 are formed in the first opening and the second opening, to electrically connect the circuits on the encapsulation substrate to the ports of the filter circuit. The connecting structure 30 may be a solder ball or a copper pillar. Where the connection structure 30 employs a solder ball, each port of the filter circuit and the encapsulation substrate 20 may be soldered together. Where the connection structure 30 employs a copper pillar, the copper pillar is required to be connected to each port of the filter circuit through a conductive bonding layer, and then the copper pillar is connected to the encapsulation substrate 20.

In some examples, a material of the protective layer may be an inorganic material, such as silicon nitride, silicon oxide, or the like; and a thickness of the protective layer is in a range of about 1 μm to 20 μm. Step S19 may include: forming the first interlayer insulating layer 301 through PVD or CVD; and then spin coating a photoresist, exposing and developing the photoresist, and etching to form the first opening and the second opening.

In some examples, the material of the protective layer may be an organic material, such as polyimide (PI) or other resin material. Step S19 may include: patterning the passivation layer through a spin coating process, to form the first opening and the second opening.

Alternatively, the manufacturing method in the embodiment of the present disclosure may further include a step of connecting the circuit on the encapsulation substrate 20 to the port of the filter circuit. Specifically, the connection may be realized by welding.

In a fourth aspect, an embodiment of the present disclosure further provides an electronic device, which includes the filter described above.

It will be understood that the above embodiments are merely exemplary embodiments adopted to illustrate the principles of the present disclosure, and the present disclosure is not limited thereto. It will be apparent to one of ordinary skill in the art that various modifications and improvements can be made without departing from the spirit and scope of the present disclosure, and such modifications and improvements are also considered to be within the scope of the present disclosure.

What is claimed is:

1. A filter circuit, comprising a first resonant sub-circuit, a second resonant sub-circuit and an impedance matching network; wherein each of the first resonant sub-circuit and the second resonant sub-circuit is connected to the impedance matching network in series;
the first resonant sub-circuit is configured to allow a signal with a frequency higher than a first frequency to pass; the second resonant sub-circuit is configured to allow a signal with a frequency lower than a second frequency to pass, and the second frequency is greater than the first frequency; the impedance matching network is configured to allow a signal between the first frequency and the second frequency to pass; the impedance matching network comprises a first capacitor, a second capacitor, a third capacitor, a fourth capacitor, a fifth capacitor and a first inductor; and
a first terminal of the first capacitor is connected to a first terminal of the fourth capacitor, and a second terminal of the first capacitor is connected to a first terminal of the first inductor and a first terminal of the second capacitor; a second terminal of the second capacitor is connected to a first terminal of the third capacitor and a second terminal of the fifth capacitor; and a second terminal of the fourth capacitor is connected to a first terminal of the fifth capacitor, a second terminal of the first inductor and a reference signal terminal.

2. The filter circuit according to claim 1, wherein the first resonator sub-circuit is connected to the first terminal of the first capacitor, the second resonator sub-circuit is connected to a second terminal of the third capacitor; or
the second resonant sub-circuit is connected to the first terminal of the first capacitor, and the first resonant sub-circuit is connected to the second terminal of the third capacitor.

3. The filter circuit according to claim 1, wherein the first resonator sub-circuit comprises a sixth capacitor and a second inductor; and the sixth capacitor is connected to the second inductor in parallel.

4. The filter circuit according to claim 3, wherein a capacitance value of the sixth capacitor is less than 20 pF; and/or an inductance value of the second inductor is less than 20 nH.

5. The filter circuit according to claim 1, wherein the second resonator sub-circuit comprises a seventh capacitor and a third inductor; and the seventh capacitor is connected to the third inductor in parallel.

6. The filter circuit according to claim 5, wherein a capacitance value of the seventh capacitor is less than 20 pF; and/or an inductance value of the third inductor is less than 20 nH.

7. The filter circuit according to claim 1, wherein a capacitance value of each the first capacitor, the second capacitor, the third capacitor, the fourth capacitor, and the fifth capacitor is less than 5 pF; and/or an inductance value of the first inductor is less than 20 nH.

8. The filter circuit according to claim 1, wherein the impedance matching network further comprises an eighth capacitor; a first terminal of the eighth capacitor is connected to the first resonant sub-circuit, and a second terminal of the third capacitor is connected to the second resonant sub-circuit; and a second terminal of the eighth capacitor is connected to the first terminal of the first capacitor and the first terminal of the fourth capacitor.

9. A filter, comprising the filter circuit according to claim 1.

10. The filter according to claim 9, further comprising a first base substrate on which the filter circuit is arranged; wherein the first resonant sub-circuit, the second resonant sub-circuit and the impedance matching network each comprise a capacitor and an inductor, and the capacitor in the impedance matching network comprise the first capacitor, the second capacitor, the third capacitor, the fourth capacitor and the fifth capacitor; the inductor in the impedance matching network comprises the first inductor; the inductor comprises a plurality of substructures sequentially arranged along a direction away from the first base substrate, an interlayer insulating layer is between any two adjacent ones of the plurality of substructures, and any two adjacent ones of the plurality of substructures are connected together through a via penetrating through the interlayer insulating layer, such that a coil structure of the inductor is formed; the capacitor comprises a first plate and a second plate sequentially arranged along the direction away from the first base substrate, and a dielectric layer between the first plate and the second plate.

11. The filter according to claim 10, wherein at least one of the first plate and the second plate is in a same layer as one of the plurality of substructures.

12. The filter according to claim 10, wherein orthographic projections of any two of the plurality of substructures on the first base substrate overlap each other.

13. The filter according to claim 10, further comprising a protective layer on a side of the inductor and the capacitor away from the first base substrate.

14. The filter according to claim 13, further comprising an encapsulation substrate, wherein an opening is in the protection layer at a position corresponding to a port of the filter circuit, and the port of the filter circuit is connected to the encapsulation substrate through the opening.

15. The filter according to claim 14, wherein a connection structure is in the opening, and the port of the filter circuit is connected to the encapsulation substrate through the connection structure.

16. An electronic device, comprising the filter according to claim 9.

17. A method of manufacturing a filter, comprising: forming a filter circuit on a first base substrate, wherein the filter circuit comprises the filter circuit according to claim 1.

18. The method of manufacturing a filter according to claim 16, wherein the first resonator sub-circuit, the second resonator sub-circuit, and the impedance matching network each comprise a capacitor and an inductor; forming the inductor comprises:

sequentially forming a plurality of substructures on the first base substrate, forming an interlayer insulating layer between any two adjacent ones of the plurality of substructures, and connecting any two adjacent ones of the plurality of substructures through a via in the interlayer insulating layer, such that a coil structure of the inductor is formed; and forming the capacitor comprises:

sequentially forming a first plate and a second plate along a direction away from the first base substrate, and forming a dielectric layer between the first plate and the second plate.

19. The method according to claim 18, wherein at least one of the first plate and the second plate is formed in one same process as one of the plurality of substructures.

20. The method according to claim 18, wherein orthographic projections of any two of the plurality of substructures on the first base substrate overlap each other.

\* \* \* \* \*